(12) United States Patent
Hsueh et al.

(10) Patent No.: US 11,294,271 B2
(45) Date of Patent: Apr. 5, 2022

(54) MASK FOR EXTREME ULTRAVIOLET PHOTOLITHOGRAPHY

(71) Applicant: Taiwan Semiconductor Manufacturing Co., Ltd., Hsinchu (TW)

(72) Inventors: Wen-Chang Hsueh, Hsinchu (TW); Hsin-Chang Lee, Hsinchu (TW); Ta-Cheng Lien, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 123 days.

(21) Appl. No.: 16/863,939

(22) Filed: Apr. 30, 2020

(65) Prior Publication Data

US 2021/0341829 A1    Nov. 4, 2021

(51) Int. Cl.
*G03F 1/24* (2012.01)

(52) U.S. Cl.
CPC ..................... *G03F 1/24* (2013.01)

(58) Field of Classification Search
CPC .......................................................... G03F 1/24
USPC ............................................................ 430/5
See application file for complete search history.

(56) References Cited

U.S. PATENT DOCUMENTS 7,049,035 B2 *   5/2006   Kindt ..................... C25D 5/022
                                                                    430/5

FOREIGN PATENT DOCUMENTS

| DE | 10 2004 013 459 A1 | 11/2004 |
| DE | 10 2004 038 548 A1 | 3/2006 |
| DE | 10 2013 104 390 A1 | 2/2014 |
| DE | 11 2009 000 965 B4 | 8/2020 |
| JP | 2017-227933 A | 12/2017 |
| TW | 201518855 A | 5/2015 |
| TW | 201725440 A | 7/2017 |
| TW | 202001407 A | 1/2020 |
| TW | 202008073 A | 2/2020 |
| TW | 202013055 A | 4/2020 |

* cited by examiner

*Primary Examiner* — Christopher G Young
(74) *Attorney, Agent, or Firm* — Seed IP Law Group LLP

(57) ABSTRACT

A method for forming an extreme ultraviolet photolithography mask includes forming a reflective multilayer, forming a buffer layer on the reflective multilayer, and forming an absorption layer on the reflective multilayer. Prior to patterning the absorption layer, an outer portion of the absorption layer is removed. Photoresist is then deposited on the top surface of the absorption layer and on sidewalls of the absorption layer. The photoresist is then patterned, and the absorption layer is etched with a plasma etching process in the presence of the patterned photoresist. The presence of the photoresist on the sidewalls of the absorption layer during the plasma etching process helps to improve uniformity in the etching of the absorption layer during the plasma etching process.

20 Claims, 12 Drawing Sheets

MASK FOR EXTREME ULTRAVIOLET PHOTOLITHOGRAPHY

BACKGROUND

Technical Field

The present disclosure relates to the field of photolithography. The present disclosure relates more particularly to forming masks for photolithography processes.

Description of the Related Art

The semiconductor integrated circuit industry has experienced exponential growth. Technological advances in integrated circuit materials and design have produced generations of integrated circuits in which each generation has smaller and more complex circuits than the previous generation. In the course of integrated circuit evolution, the number of interconnected devices per chip area has generally increased while the sizes of the smallest components that can be created using a fabrication process has decreased.

This scaling down process generally provides benefits by increasing production efficiency and lowering associated costs. Such scaling down has also increases the complexity of integrated circuit processing and manufacturing. For these advances to be realized, similar developments in integrated circuit processing and manufacturing are needed. For example, the need to perform higher resolution photolithography processes grows.

Extreme ultraviolet photolithography is photolithography process that employs scanners using light in the extreme ultraviolet region having wavelengths of about 1-20 nm. Extreme ultraviolet scanners provide a desired pattern on an absorption layer formed on a reflective mask. The pattern of the absorption layer is utilized to form features on a semiconductor wafer based on the pattern.

DETAILED DESCRIPTION

Figure 1:
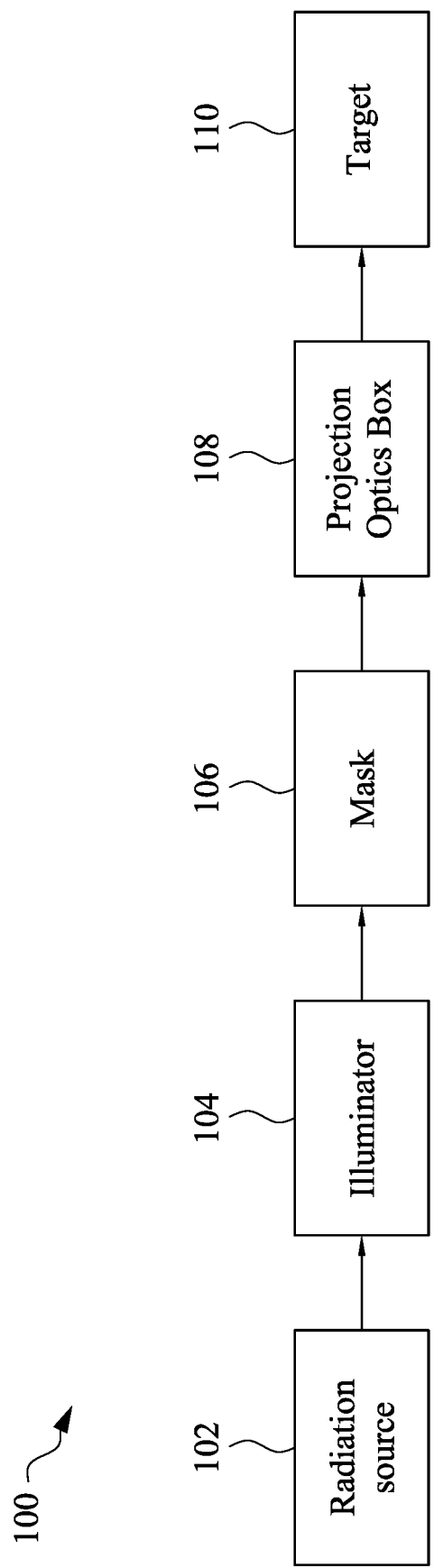
FIG. 1 is a block diagram of an extreme ultraviolet photolithography system, according to one embodiment.

In the following description, many thicknesses and materials are described for various layers and structures within a photolithography mask. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

FIG. 1 is a block diagram of an extreme ultraviolet photolithography system 100, according to one embodiment. The system includes a radiation source 102, an illuminator 104, a mask 106, a projection optics box 108, and a target 110. The components of the system 100 cooperate together to perform extreme ultraviolet photolithography processes.

The radiation source 102 outputs ultraviolet radiation. The ultraviolet radiation has a wavelength of about 1-20 nm. The ultraviolet radiation may include other wavelengths without departing from the scope of the present disclosure.

The illuminator 104 receives the ultraviolet radiation from the radiation source. The illuminator 104 may include refractive optics, such as a single lens or a lens system having multiple lenses (zone plates) and/or reflective optics, such as a single mirror or a mirror system having multiple mirrors. The illuminator directs ultraviolet radiation from the radiation source 102 onto the mask 106.

The mask 106 receives the ultraviolet radiation from the illuminator 104. The mask 106 can be a transmissive mask or a reflective mask. In one embodiment, the mask 106 is a reflective mask such as described in further detail below. The mask 106 may incorporate other resolution enhancement techniques such as phase-shifting mask (phase-shifting mask) and/or optical proximity correction (optical proximity correction).

The projection optics box 108 receives the ultraviolet radiation from the mask 106. The projection optics box 108 may have refractive optics or reflective optics. The radiation reflected from the mask 106 (e.g., a patterned radiation) is collected by the projection optics box 108. The projection optics box 108 may include a magnification less than one (thereby reducing the patterned image included in the radiation). The projection optics box directs the ultraviolet radiation onto the target 110.

In one embodiment, the target 110 includes a semiconductor wafer. A layer of photoresist typically covers the target during extreme ultraviolet photolithography irradiation. The photoresist assists in patterning a surface of the semiconductor wafer in accordance with the pattern of the mask 106.

The projection optics box 108 focuses the extreme ultraviolet light onto the target 110. The extreme ultraviolet light irradiates the photoresist with a pattern corresponding to the pattern of the mask 106. The exposed portions of the photoresist undergo a chemical change that enables portions of the photoresist to be removed. This pattern leaves photoresist on the surface of the semiconductor wafer in a pattern of the mask 106. Etching processes, thin film deposition processes, and/or doping processes are performed in the presence of the patterned photoresist.

Typically, a large number of masks 106 are utilized during fabrication of a single semiconductor wafer. Each mask has a particular pattern corresponding to semiconductor fabrication processes. One or more etching, deposition, or doping processes are performed in accordance with each mask.

If there are defects in the mask 106, then corresponding defects may occur in the various semiconductor processes associated with the mask 106. The defects that propagate from the mask 106 to the fabrication processes can result in semiconductor devices that do not function properly. Semiconductor devices that do not function properly represent a waste of large amounts of resources due to the large amount of time, expensive tools, and expensive materials required to fabricate each semiconductor device. Accordingly, it is beneficial to reduce as many as defects in the mask 106.

The photolithography system 100 described in relation to FIG. 1 is one example of some components of a photolithography system. A photolithography system can include other components, processes, and configurations than those described above without departing from the scope of the present disclosure.

Figure 2:
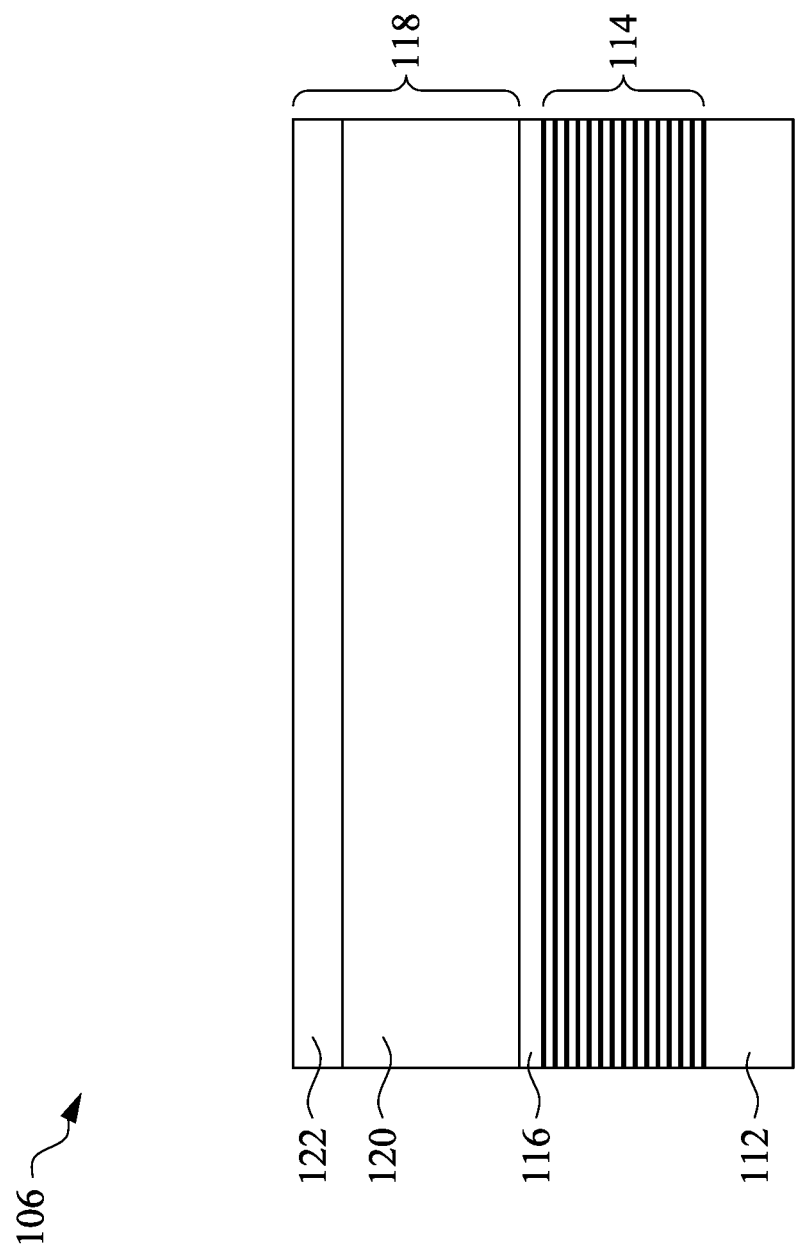
FIG. 2 is a cross-sectional view of a photolithography mask at an intermediate stage of processing, according to one embodiment.

FIG. 2 is a cross-section of an extreme ultraviolet photolithography mask 106 during an intermediate stage of processing, according to one embodiment. The mask 106 includes a substrate 112, a reflective multilayer 114 positioned on the substrate 112, a buffer layer 116 positioned on the reflective multilayer 114, and an absorption layer 118 positioned on the buffer layer 116. The fabrication process of the mask 106 eventually results in the mask 106 having a selected pattern in the absorption layer 118.

The substrate 112 includes a low thermal expansion material. The low thermal expansion material substrate 112 serves to minimize image distortion due to heating of the mask 106. The low thermal expansion material substrate 112 can include materials with a low defect level and a smooth surface.

In one embodiment, the substrate 112 can include $SiO_2$. The substrate 112 can be doped with titanium dioxide. The substrate 112 can include other low thermal expansion materials than those described above without departing from the scope of the present disclosure.

Though not shown herein, in one embodiment the substrate 112 may be positioned on a conductive layer. The conductive layer can assist in electrostatically chucking the mask 106 during fabrication and use of the mask 106. In one embodiment, the conductive layer includes chromium nitride. The conductive layer can include other materials without departing from the scope of the present disclosure.

The mask 106 includes the reflective multilayer 114. The reflective multilayer 114 is positioned on the substrate 112. The reflective multilayer 114 is configured to reflect the extreme ultraviolet light during photolithography processes in which the mask 106 is used. The reflective properties of the reflective multilayer 114 are described in more detail below.

In one embodiment, the reflective multilayer 114 operates in accordance with reflective properties of the interface between two materials. In particular, reflection of light will occur when light is incident at the interface between two materials of different refractive indices. A greater portion of the light is reflected when the difference in refractive indices is larger.

One technique to increase the proportion of reflected light is to include a plurality of interfaces by depositing a multilayer of alternating materials. The properties and dimensions of the materials can be selected so that constructive interference occurs with light reflected from different interfaces. However, the absorption properties of the employed materials for the plurality of layers may limit the reflectivity that can be achieved.

Accordingly, the reflective multilayer 114 includes a plurality of pairs of layers. Each pair of layers includes a layer of a first material and a layer of a second material. The materials and thicknesses of the layers are selected to promote reflection and constructive interference of extreme ultraviolet light.

In one embodiment, each pair of layers includes a layer of molybdenum and a layer of silicon. In one example, the layer of molybdenum is between 2 nm and 4 nm in thickness. In one example, the layer of silicon is between 3 nm and 5 nm in thickness. The thicknesses of the layers in the reflective multilayer 114 are selected based on the expected wavelength of extreme ultraviolet light used in the photolithography processes and the expected angle of incidence of the extreme ultraviolet light during the photolithography processes. The wavelength of the extreme ultraviolet light is between 1 nm and 20 nm. The number of pairs of layers is between 20 pairs of layers and 60 pairs of layers, according to one embodiment. Other materials, thicknesses, numbers of pairs, and configurations of layers in the reflective multilayer 114 can be utilized without departing from the scope of the present disclosure. Other wavelengths of extreme ultraviolet light can be used without departing from the scope of the present disclosure.

In one embodiment, the buffer layer 116 is positioned on the reflective multilayer 114. One purpose of the buffer layer 116 is to protect the reflective multilayer during etching processes of the absorption layer 118. Accordingly, the buffer layer 116 includes materials that are resistant to etching by etching processes that etch the absorption layer 118. The etching processes and the materials of the absorption layer will be described in more detail below.

In one embodiment, the buffer layer 116 includes ruthenium. The buffer layer 116 can include compounds of ruthenium including ruthenium boride and ruthenium silicide. The buffer layer can include chromium, chromium oxide, or chromium nitride. The buffer layer 116 can be deposited by a low temperature deposition process to prevent diffusion of the buffer layer 116 into the reflective multilayer 114. In one embodiment, the buffer layer 116 has a thickness between 2 nm and 4 nm. Other materials, deposition processes, and thicknesses can be utilized for the buffer layer 116 without departing from the scope of the present disclosure.

The absorption layer 118 is positioned on the buffer layer 116. The material of the absorption layer 118 is selected to have a high absorption coefficient for wavelengths of extreme ultraviolet radiation that will be used in the photolithography processes with the mask 106. In other words, the materials of the absorption layer 118 are selected to absorb extreme ultraviolet radiation.

In one embodiment, the absorption layer 118 is between 40 nm and 100 nm in thickness. In one embodiment, the absorption layer 118 includes material selected from a group including chromium, chromium oxide, titanium nitride, tantalum nitride, tantalum, titanium, aluminum-copper, palladium, tantalum boron nitride, tantalum boron oxide, aluminum oxide, molybdenum, or other suitable materials. Other materials and thicknesses can be used for the absorption layer 118 without departing from the scope of the present disclosure.

In one embodiment, the absorption layer 118 includes a first absorption layer 120 and a second absorption layer 122. The first absorption layer 118 is positioned on the buffer layer 116. The second absorption layer 122 is positioned on the first absorption layer 120.

In one embodiment, the first absorption layer 120 includes tantalum boron nitride. The second absorption layer 122 includes tantalum boron oxide. The thickness of the first absorption layer is between 30 nm and 80 nm. The thickness of the second absorption layer 122 is between 1 nm and 40 nm. The absorption layer 118 can include different materials, thicknesses, and numbers of layers than those described above without departing from the scope of the present disclosure. In one embodiment, the absorption layer 118 includes only a single absorption layer. Accordingly, the absorption layer 118 can be an absorption layer.

The layers of the mask 106 shown in FIG. 2 may be formed by various thin-film deposition processes. The thin-film deposition processes can include including physical vapor deposition process such as evaporation and DC magnetron sputtering, a plating process such as electroless plating or electroplating, a chemical vapor deposition process such as atmospheric pressure chemical vapor deposition, low pressure chemical vapor deposition, plasma enhanced chemical vapor deposition, high density plasma chemical vapor deposition, ion beam deposition, spin-on coating, metal-organic decomposition, and/or other methods known in the art.

Figure 3:
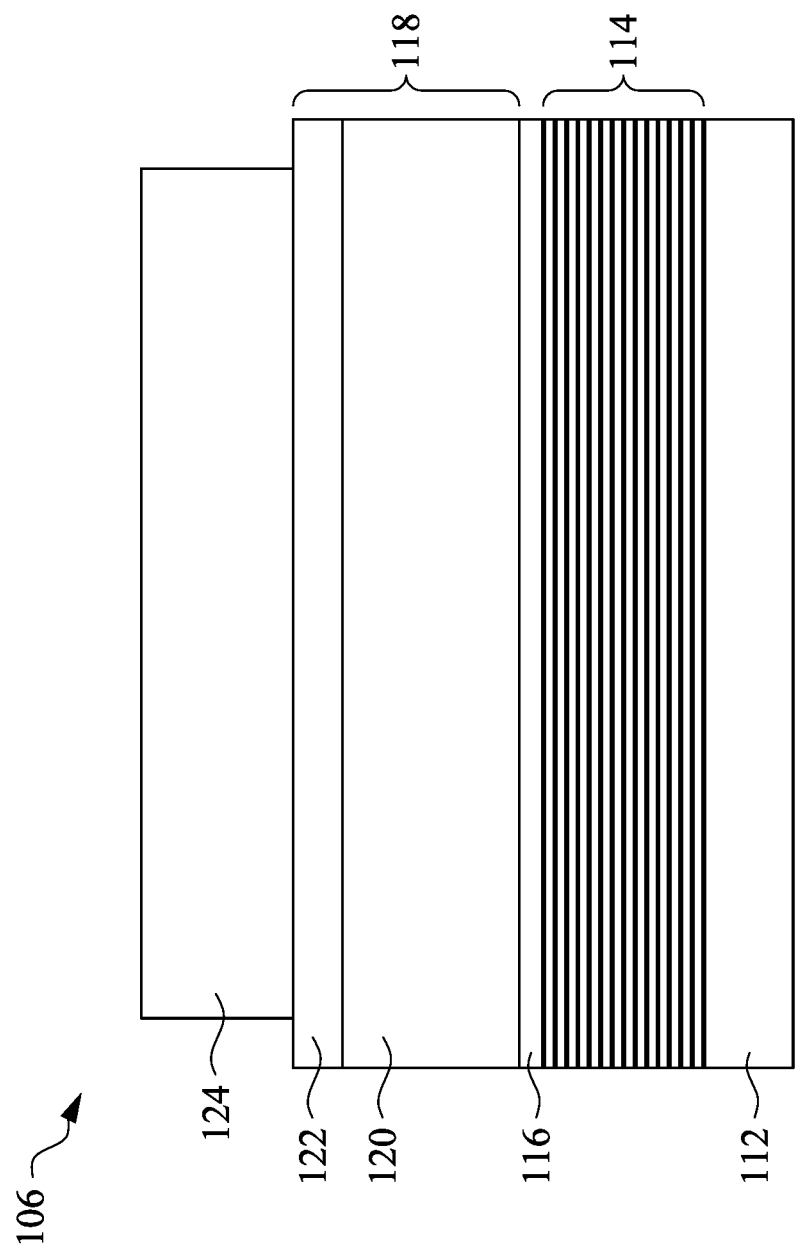
FIG. 3 is a cross-sectional view of a photolithography mask at an intermediate stage of processing, according to one embodiment.

FIG. 3 is a cross-section of a photolithography mask 106 at an intermediate stage of processing, according to one embodiment. In FIG. 3, a layer of photoresist 124 has been deposited on the absorption layer 118. In particular, the layer of photoresist 124 has been deposited on the second absorption layer 122. The layer of photoresist 124 has been patterned and developed to expose an outer edge of the top surface of the absorption layer 118.

The layer of photoresist 124 can be patterned using common photolithography techniques including exposing the photoresist 124 to light or e-beam processes through a photolithography mask and developing the photoresist to remove the outer perimeter of the photoresist 124 in accordance with a pattern of the photolithography mask.

In one embodiment, the width of the exposed portion of the top surface of the absorption layer 122 is between 0.2 mm and 2 mm. In other words, the edge of the photoresist 124 is between 0.2 mm and 2 mm from the edge of the absorption layer 118. Though not shown in FIG. 3, the mask 106 may be substantially rectangular from a top view. The exposed portion of the absorption layer 118 corresponds to an outer edge of the rectangle. Those of skill in the art will recognize, in light of the present disclosure that the exposed portion of the absorption layer 118 can have other dimensions and shapes, without departing from the scope of the present disclosure. For example, other widths are possible for the exposed portion of the top surface of the absorption layer 122 without departing from the scope of the present disclosure. For example, in other embodiments, the width of the exposed portion of the top surface of the absorption layer 122 is between 0.2 mm to 3 mm.

Figure 4A:
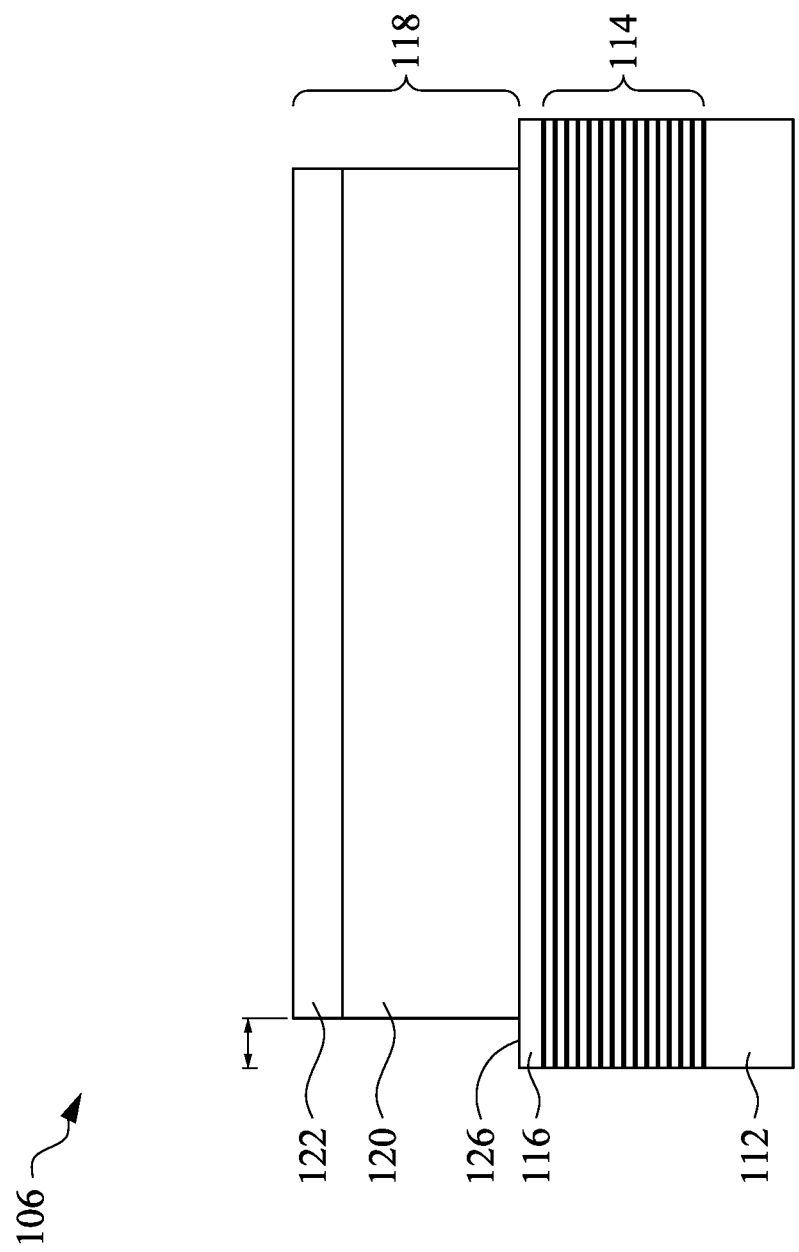
FIG. 4A is a cross-sectional view of a photolithography mask at an intermediate stage of processing, according to one embodiment.

FIG. 4A is a cross-section of the mask 106 at an intermediate stage of processing, according to one embodiment. In the illustrated embodiment of FIG. 4A, an outer portion of the absorption layer 118 has been removed. The outer portion of the absorption layer 118 can be removed by an etching process in the presence of the patterned photoresist 124. The photoresist 124 is then removed. The result of the etching process is that an outer portion 126 of the top surface of the buffer layer 116 is exposed. The exposed portion corresponds to the pattern of the photoresist 124 in FIG. 3. The exposed portion 126 is between 0.2 mm and 2 mm in width. The exposed portion 126 extends around the perimeter of the mask 106. The exposed portion 126 should be wide enough to enable photoresist to stably cover the sidewalls of the absorption layer, for reasons that will be set forth in more detail below. The exposed portion 126 should be narrow enough to enable full patterning of the absorption layer in accordance with a selected pattern for the mask 106 to be used in extreme ultraviolet photolithography processes. Accordingly, the range of values can be selected based, in part, on the particular type of photoresist to be used in patterning the absorption layer.

In one embodiment, the etching process may include dry plasma etching, wet etching, and/or other etching methods. In the present embodiment, a multiple-step dry etching is implemented. In one embodiment, the etching process can include a two-step plasma etching process. The second absorption layer 122 can be etched with a first plasma etching process. The first absorption layer 120 can be etched with a second plasma etching process.

Those of skill in the art will recognize, in light of the present disclosure, that other processes than those described in relation to FIG. 3 and FIG. 4A can be utilized to form a mask having a pattern in accordance with FIG. 4A without departing from the scope of the present disclosure.

Figure 4B:
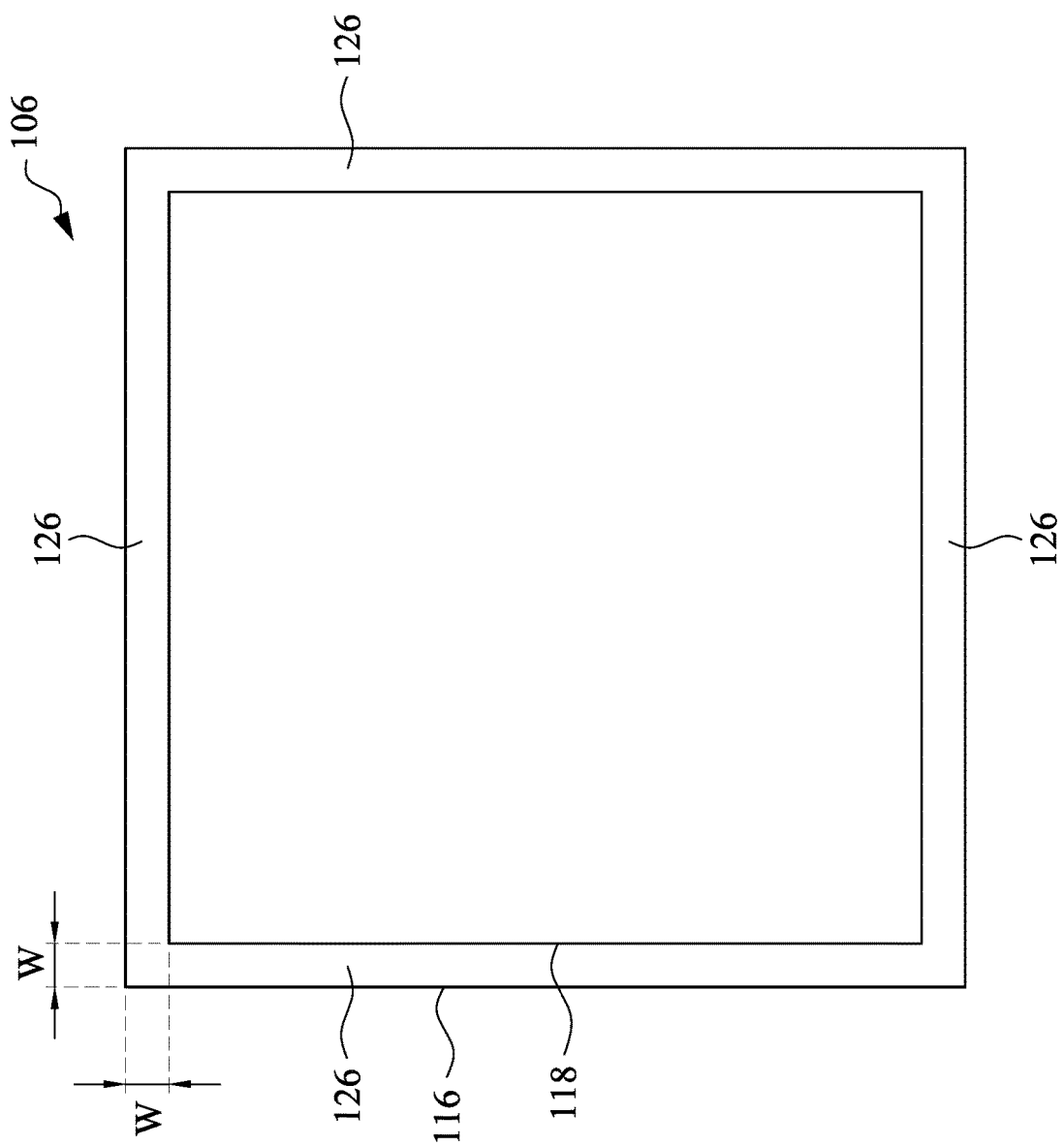
FIG. 4B is a top view of the photolithography mask of FIG. 4A, according to one embodiment.

FIG. 4B is a top view of the photolithography mask 106 of FIG. 4A, according to one embodiment. In the view of FIG. 4B, the absorption layer 118 is positioned on the buffer layer 116. The absorption layer 118 does not entirely cover the top surface of the buffer layer 116. An outer portion 126 of the top surface of the buffer layer 116 is not covered by the absorption layer. The width W of the exposed portion 126 of the top surface of the buffer layer 116 is between 0.2 mm and 2 mm. Other widths are possible for the exposed portion 126 without departing from the scope of the present disclosure. For example, in accordance with other embodiments of the present disclosure, the width W of the exposed portion 126 of the top surface of the buffer layer 116 is between 0.2 mm to 3 mm. Although the width W of the exposed portion 126 is shown as being the same on all sides of the photolithography mask 106 in FIG. 4B, in some embodiments the exposed portion 126 may have differing widths on different sides of the photolithography mask 106.

In one embodiment, a lateral width of the absorption layer 118 is smaller than a lateral width of the buffer layer 116. In one embodiment, an outer perimeter of the top surface of the buffer layer 116 is exposed by the absorption layer 118 because the absorption layer 118 does not cover the outer perimeter of the top surface of the buffer layer 116. In one embodiment, the exposed portion 126 has the shape of a frame surrounding the absorption layer 118. The mask 106 is substantially rectangular, though other shapes are possible for the mask 106 without departing from the scope of the present disclosure.

Figure 5:
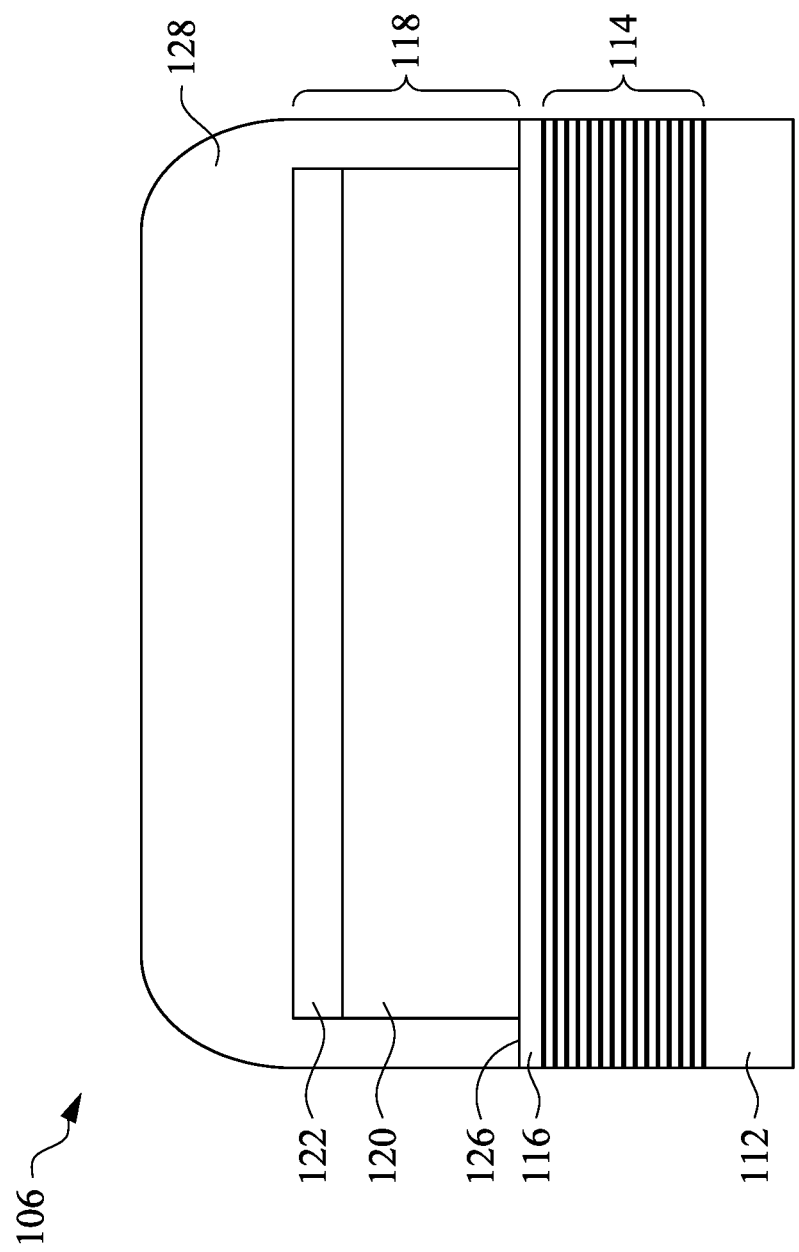
FIG. 5 is a cross-sectional view of a photolithography mask at an intermediate stage of processing, according to one embodiment.

FIG. 5 is a cross-section of the photolithography mask 106 at an intermediate stage of processing, according to one embodiment. In FIG. 5, a layer of photoresist 128 has been deposited on the absorption layer 118. The photoresist 118 is positioned on a top surface of the absorption layer 118, on lateral surfaces of the absorption layer 118, and on the exposed portion 126 of the buffer layer 116. The photoresist 128 is utilized to assist in patterning the absorption layer 118 in accordance with a final pattern of the mask 106. As will be described in more detail below, several benefits result from removing an outer perimeter of the absorption layer 118 such that the photoresist 128 covers the lateral surfaces of the absorption layer 118.

Figure 6:
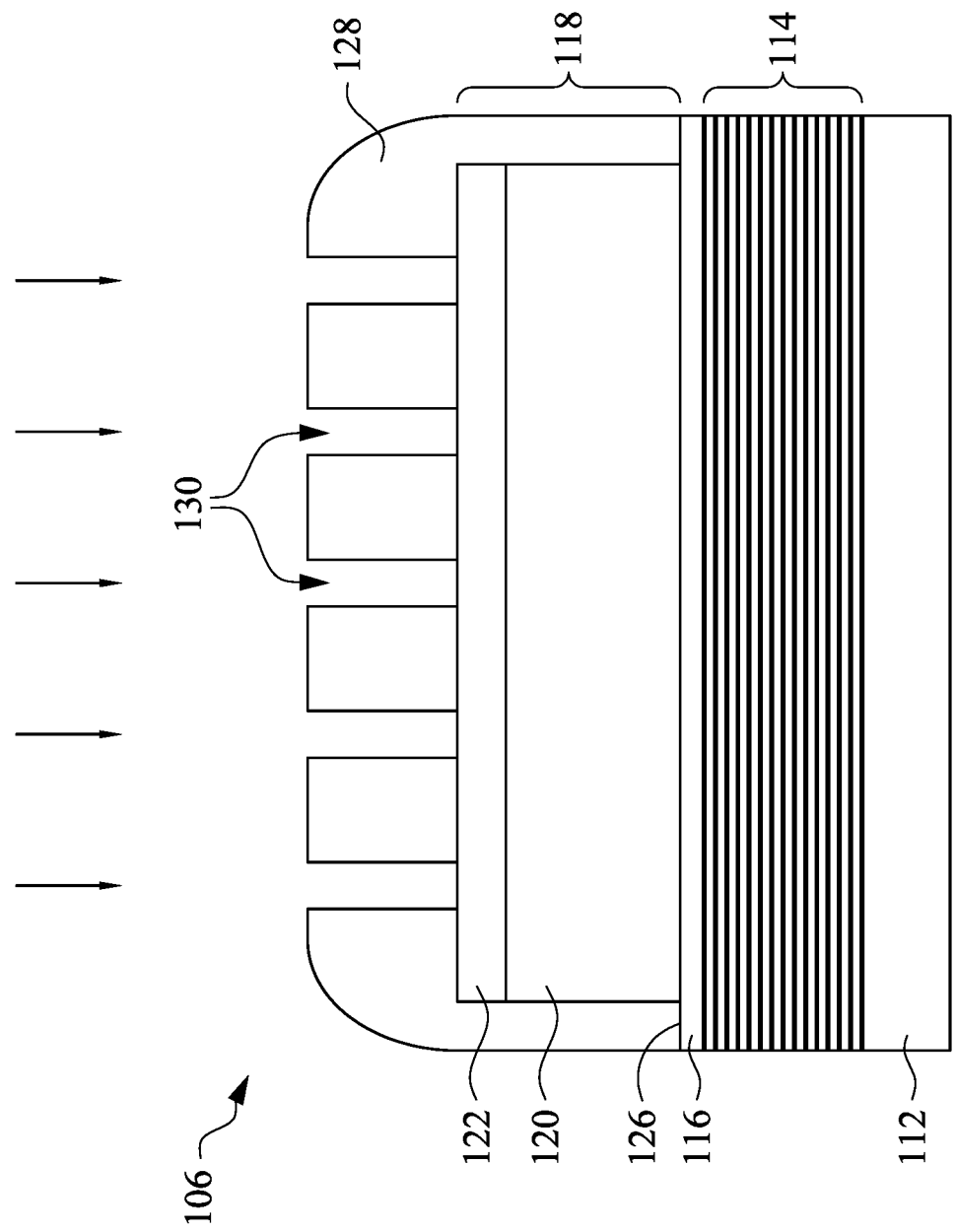
FIG. 6 is a cross-sectional view of a photolithography mask at an intermediate stage of processing, according to one embodiment.

FIG. 6 is a cross-section of the photolithography mask 106, according to one embodiment. In FIG. 6, the photoresist 128 has been patterned. The patterning results in trenches 130 formed in the photoresist 128. Portions of the top surface of the absorption layer 118 are exposed via the trenches 130 formed in the photoresist 128.

In one embodiment, the trenches 130 are formed in the photoresist 128 by exposing the photoresist 128 to an e-beam process through a mask. The patterning can include exposing the photoresist to an e-beam process, baking the photoresist 128, and developing the photoresist 128, leaving the pattern of trenches 130 in the photoresist 128. Those of skill in the art will recognize, in light of the present disclosure, that many types of photolithography and patterning processes can be utilized to pattern the photoresist 128 as shown in FIG. 6.

Figure 7:
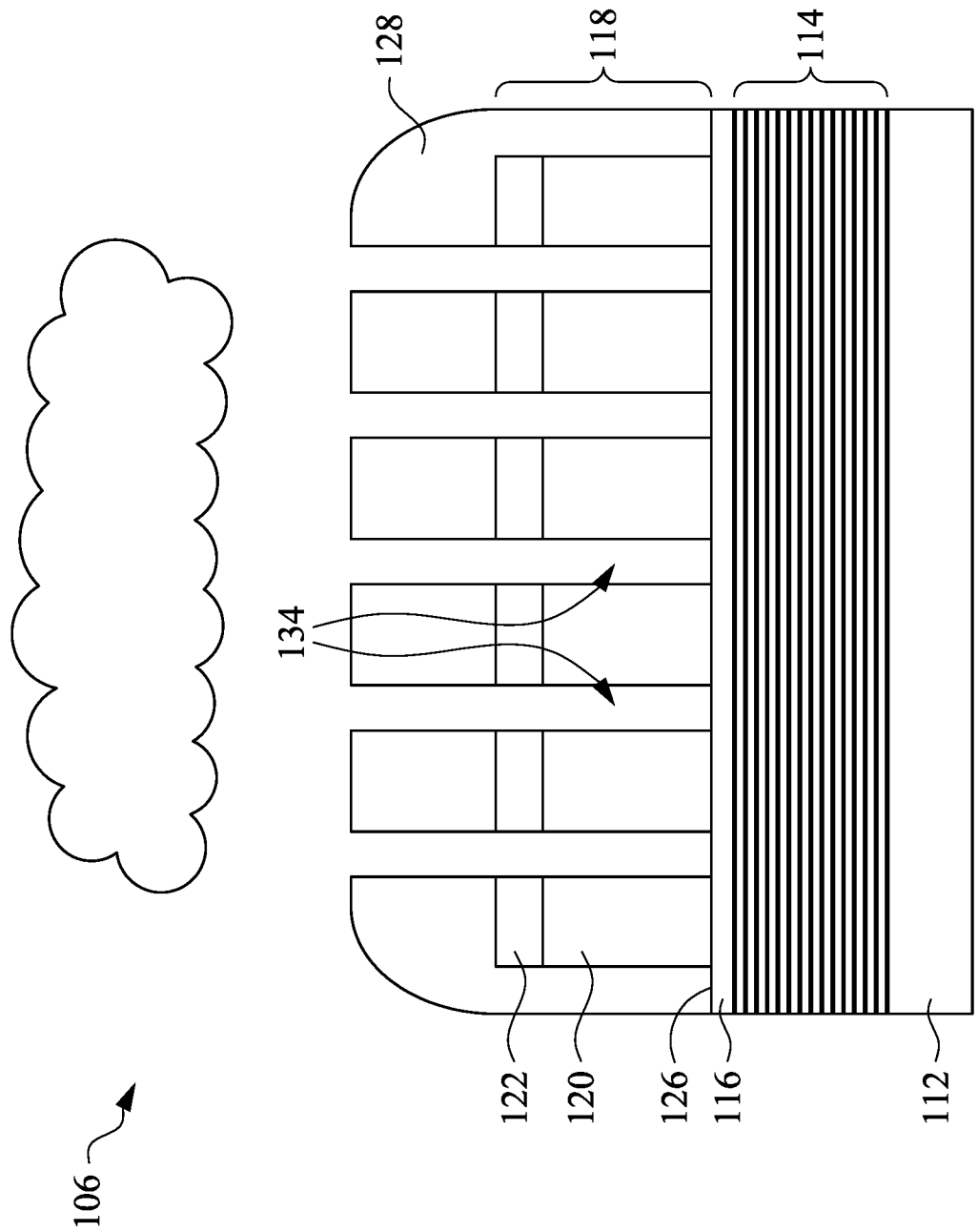
FIG. 7 is a cross-sectional view of a photolithography mask at an intermediate stage of processing, according to one embodiment.

FIG. 7 is a cross-section of the photolithography mask 106 at an intermediate stage of processing, according to one embodiment. The mask 106 has been subjected to an etching process. The etching process of FIG. 7 etches the exposed portions of the absorption layer 118 via the trenches 130 in the photoresist 128. The result of the etching process is that the absorption layer 118 is etched in accordance with the pattern of the photoresist 128 in FIG. 6. The etching process leaves trenches 134 in the absorption layer 118 in the pattern of the photoresist 128.

In one embodiment, the etching process stops at the buffer layer 116. Accordingly, the top surface of buffer layer 116 is exposed through the trenches 134 in the photoresist 128. The etching process for the absorption layer 118 is selected so that the absorption layer 118 is selectively etched with respect to the buffer layer 116. Accordingly, the buffer layer 116 is not etched by the process that etches the absorption layer 118.

In one embodiment, the etching process for the absorption layer 118 is a plasma etching process. The plasma etching process includes generating a plasma with a chlorine-based gas. The chlorine gas plasma etching process selectively etches the absorption layer 118 with respect to the buffer layer 116. In one embodiment, the plasma etching process can start with a fluorine gas plasma to etch the second absorption layer 122. The plasma etching process can then switch to a chlorine gas plasma to etch the first absorption layer 120. Other types of etching processes can be utilized without departing from the scope of the present disclosure.

Figure 8:
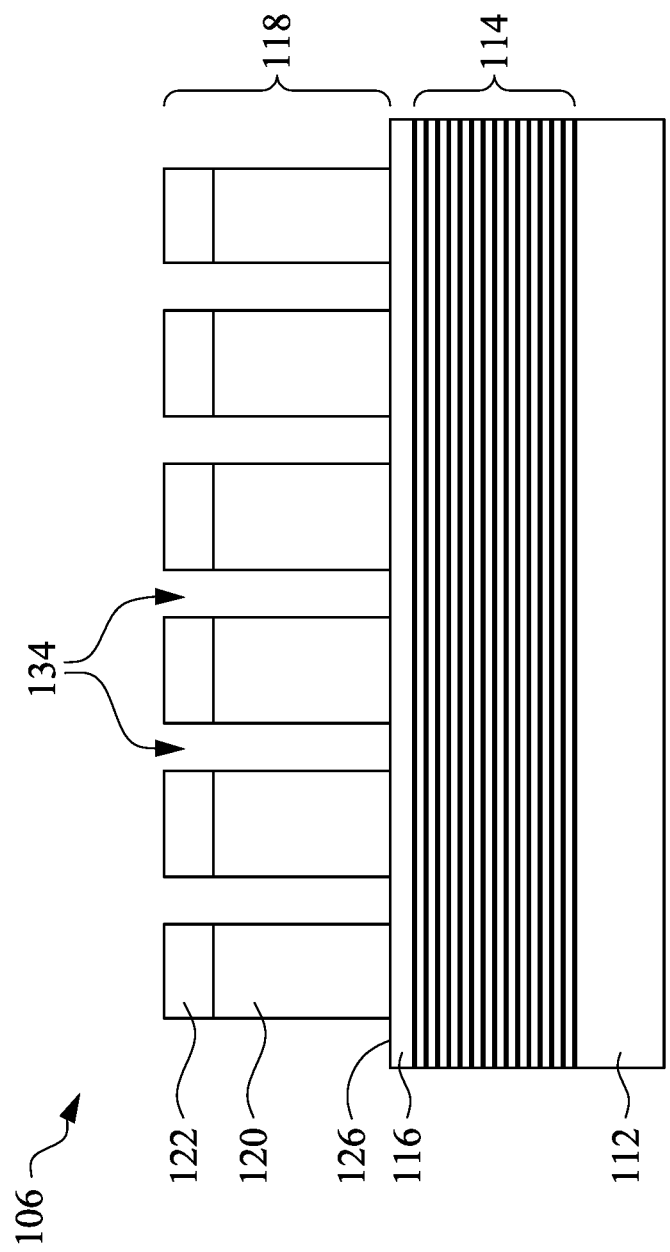
FIG. 8 is a cross-sectional view of a photolithography mask, according to one embodiment.

FIG. 8 is a cross-section of the mask 106, according to one embodiment. In the view of FIG. 8, the photoresist 128 has been removed. The absorption layer 118 remains patterned with trenches 134. The top surface of the buffer layer 116 is exposed through the trenches 134 in the absorption layer 118 and along an outer perimeter of the mask 106.

Figure 9:
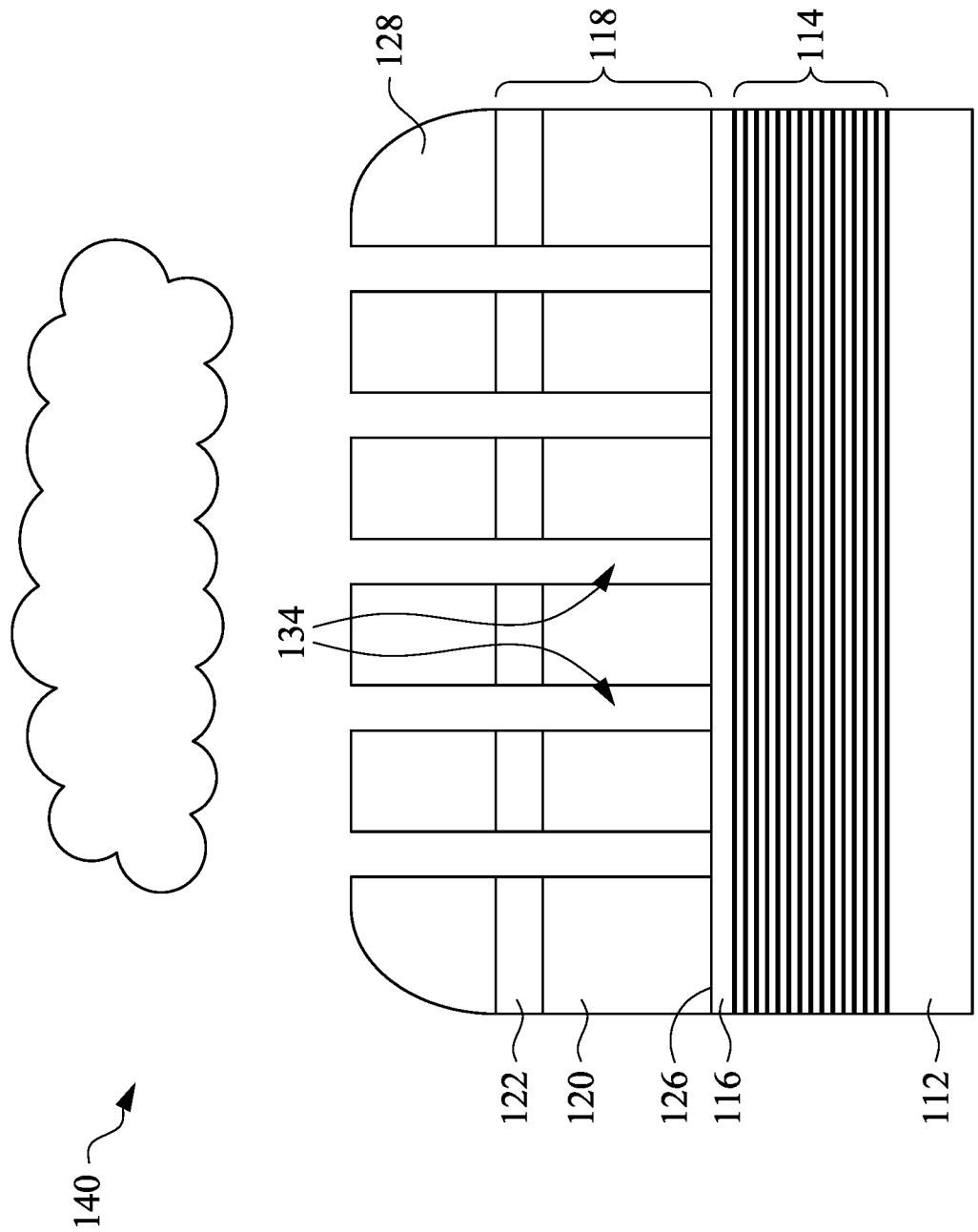
FIG. 9 is a cross-sectional view of a photolithography mask at an intermediate stage of processing, according to one embodiment.

Some of the benefits of the mask fabrication process shown in relation to FIGS. 2-8 are illustrated by comparison with a different process for mask fabrication shown in relation to FIG. 9.

FIG. 9 is a cross-section of a photolithography mask 140 at an intermediate stage of processing, according to one embodiment. The photolithography mask 140 includes a substrate 112, a reflection multilayer 114, a buffer layer 116, and an absorption layer 118. A patterned layer of photoresist 128 covers the absorption layer 118. Trenches 134 have been etched in the absorption layer 118 in accordance with the patterned photoresist 128.

The photolithography mask 140 of FIG. 9 is similar in many regards to the photolithography mask 106 of FIG. 7. However, one difference between the photolithography mask 140 and the photolithography mask 106 of FIG. 7 is that in the mask 140 the photoresist 128 does not cover the lateral surfaces of the absorption layer 118 in FIG. 9. This is because the absorption layer 118 of the mask 140 has not been patterned to expose the outer perimeter of the buffer layer 116, unlike the mask 106. In particular, the photolithography processes of FIGS. 3 and 4A etched an outer perimeter of the absorption layer 118, exposing a portion 126 of the top surface of the buffer layer 116. One of the results of the photolithography processes shown in FIGS. 3 and 4A is that the photoresist 128 in FIGS. 5-7 covers the lateral surfaces of the absorption layer 118 of the mask 106.

Accordingly, during the plasma etch process described in relation to FIG. 7 for forming the trenches 134 in the absorption layer 118 of the mask 106, the lateral surfaces of the absorption layer 118 are covered by the photoresist 128. The photoresist 128 of the mask 140 of FIG. 9 does not cover the lateral surfaces of the absorption layer 118. Accordingly, the lateral surfaces of the absorption layer 118 of the mask 140 are exposed during the plasma etching process for etching the trenches 134.

The absorption layer 118 is relatively conductive compared to the reflective multilayer 114 in the substrate 112. If the lateral surfaces of the absorption layer are exposed during the plasma etch, relatively high voltage differences may develop between different areas of the top surface of the absorption layer 118 during the plasma etching process. The result is that the plasma etches at a faster rate at different areas of the absorption layer 118 during the plasma etching process.

Different etching rates at different areas of the absorption layer 118 result in disparities between the trenches 134 at different parts of the absorption layer 118. This in turn leads to site to site differences when processing semiconductor wafers using the mask 140. The site the site differences can cause some areas of the semiconductor wafers to have defects. These defects may result in some of the integrated circuits that result from the semiconductor wafers being nonfunctioning. As described previously this can correspond to a large waste of money, time, and resources.

The mask 106 of FIG. 8 does not suffer these drawbacks. Because the outer lateral surfaces or sidewalls of the absorption layer 118 of the mask 106 are covered by the photoresist 128 during the plasma etching process of FIG. 7, the surface voltage of the absorption layer 118 is stable. Because the surface voltage of the absorption layer is stable, the etching rate of the absorption layer 118 is constant at all exposed locations of the absorption layer 118. Furthermore, semiconductor wafers processed with the mask 106 will not suffer the defects that may be suffered by semiconductor wafers processed with the mask 140 of FIG. 9.

Figure 10:
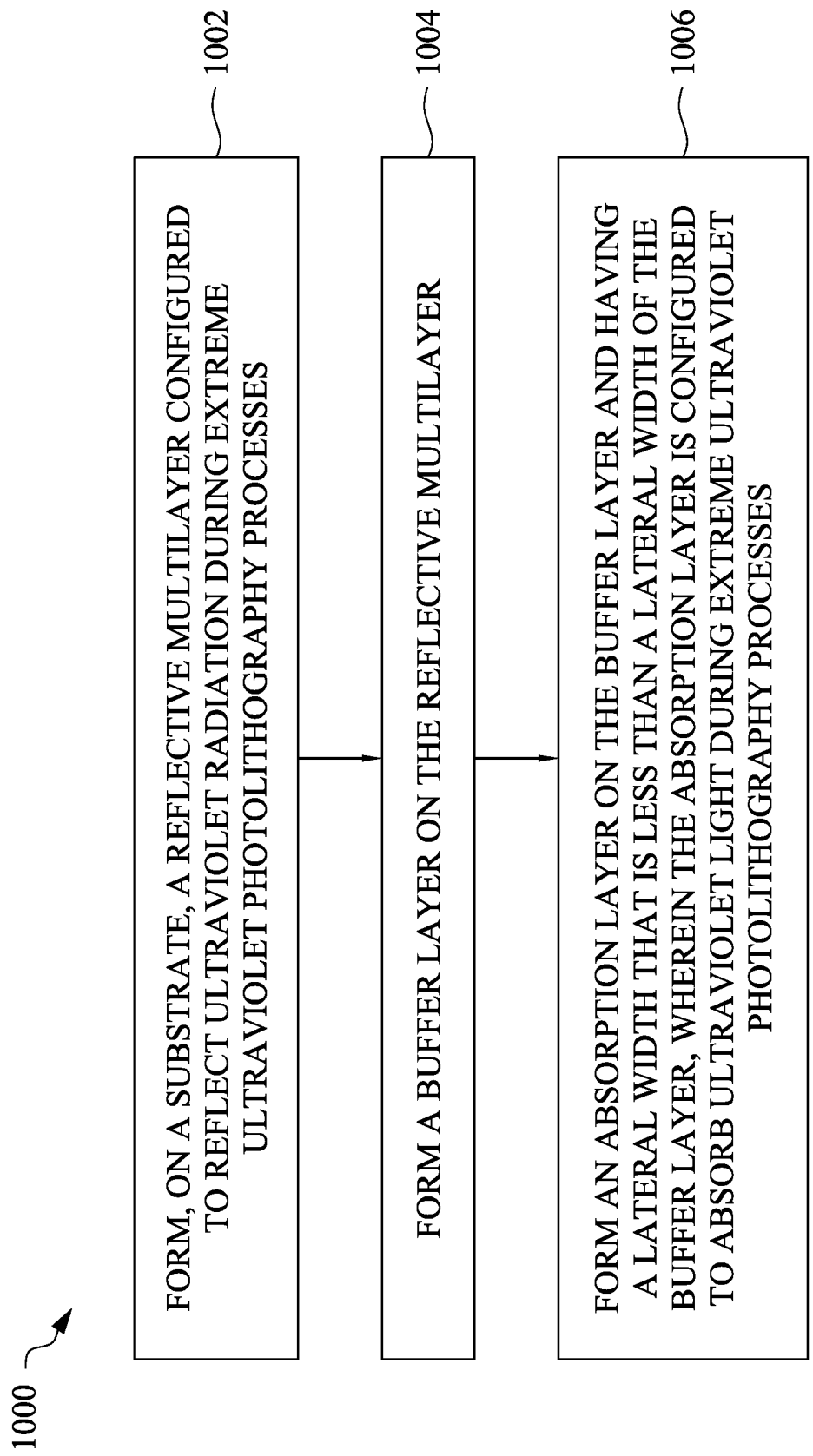
FIG. 10 is a flow diagram of a method for forming a photolithography mask, according to one embodiment.

FIG. 10 is a flow diagram of a method 1000 for forming an extreme ultraviolet photolithography mask, according to one embodiment. At 1002 the method 1100 includes forming, on a substrate, a reflective multilayer configured to reflect ultraviolet radiation during extreme ultraviolet photolithography processes. One example of a substrate is the substrate 112 of FIG. 2. One example of a reflective multilayer is the reflective multilayer 114 of FIG. 2. At 1004 the method 1000 includes forming a buffer layer on the reflective multilayer. One example of a buffer layer is the buffer layer 116 of FIG. 2. At 1006 the method 1000 includes forming an absorption layer on the buffer layer and having a lateral width that is less than a lateral width of the buffer layer, wherein the absorption layer is configured to absorb ultraviolet light during extreme ultraviolet photolithography processes. One example of an absorption layer is the absorption layer 118 of FIG. 2.

Figure 11:
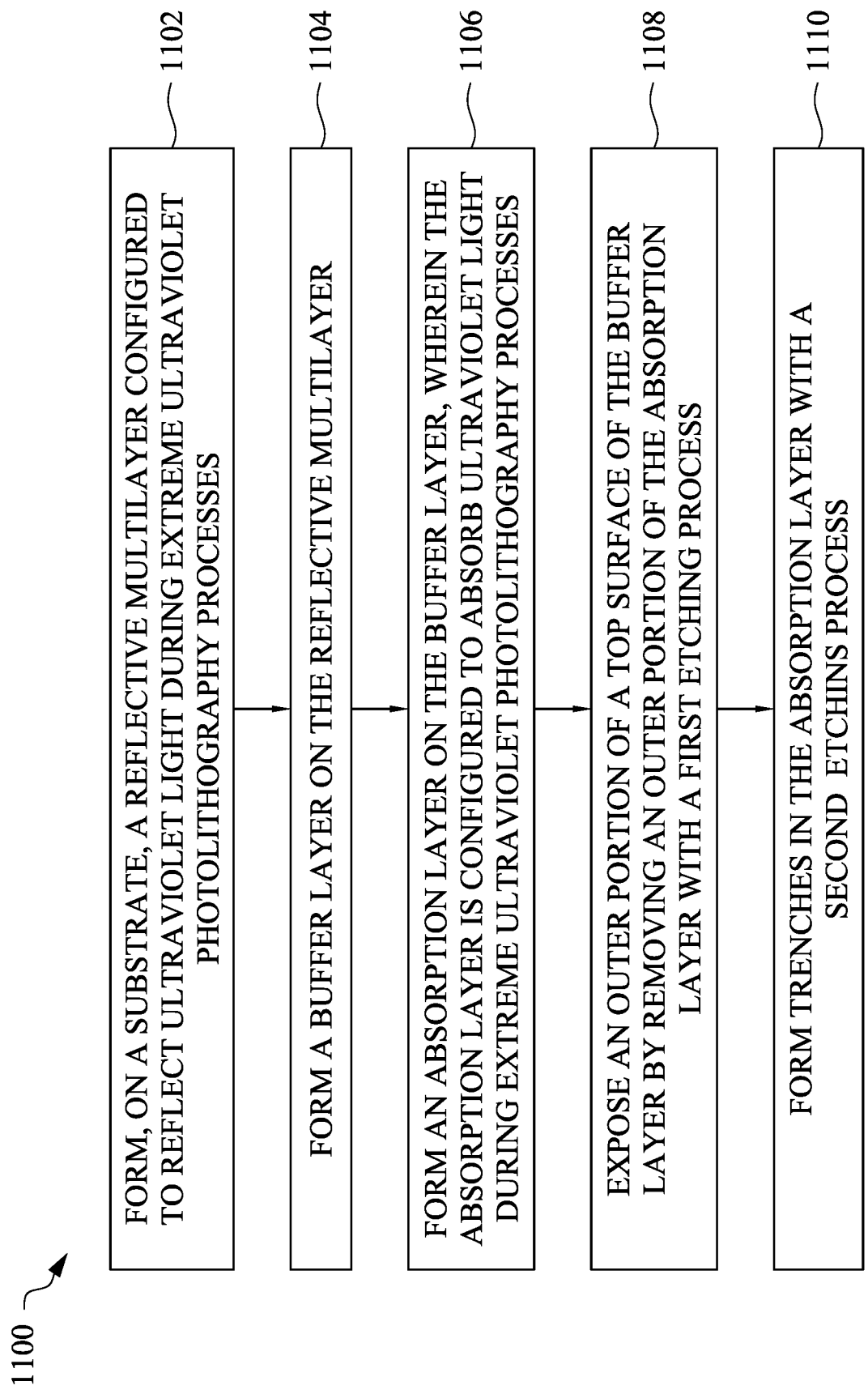
FIG. 11 is a flow diagram of a method for forming a photolithography mask, according to one embodiment.

FIG. 11 is a flow diagram of a method 1100 for forming an extreme ultraviolet photolithography mask, according to one embodiment. At 1102 the method 1100 includes forming, on a substrate, a reflective multilayer configured to reflect ultraviolet light during extreme ultraviolet photolithography processes. One example of a substrate is the substrate 112 of FIG. 2. One example of a reflective multilayer is the reflective multilayer 114 of FIG. 2. At 1104 the method 1100 includes forming a buffer layer on the reflective multilayer. One example of a buffer layer is the buffer layer 116 of FIG. 2. At 1106 the method 1100 includes forming an absorption layer on the buffer layer, wherein the absorption layer is configured to absorb ultraviolet light during extreme ultraviolet photolithography processes. One example of an absorption layer is the absorption layer 118 of FIG. 2. At 1108 the method 1100 includes exposing an outer portion of a top surface of the buffer layer by removing an outer portion of the absorption layer with a first etching process. At 1110 the method includes forming trenches in the absorption layer with a second etching process.

In one embodiment an extreme ultraviolet photolithography mask includes a substrate and a reflective multilayer positioned on the substrate and configured to reflect ultraviolet radiation during extreme ultraviolet photolithography processes. The mask includes a buffer layer positioned on the reflective multilayer and an absorption layer positioned on the buffer layer and configured to absorb ultraviolet light during extreme ultraviolet photolithography processes. At least one outer edge of the absorption layer is separated laterally from a corresponding outer edge of the buffer layer such that a peripheral portion of a top surface of the buffer layer is exposed.

In one embodiment a method includes forming, on a substrate, a reflective multilayer configured to reflect ultraviolet radiation during extreme ultraviolet photolithography processes. The method includes forming a buffer layer on the reflective multilayer. The method includes forming an absorption layer on the buffer layer and having a lateral width that is less than a lateral width of the buffer layer. The absorption layer is configured to absorb ultraviolet light during extreme ultraviolet photolithography processes.

In one embodiment a method includes forming, on a substrate, a reflective multilayer configured to reflect ultraviolet light during extreme ultraviolet photolithography processes. The method includes forming a buffer layer on the reflective multilayer and forming an absorption layer on the buffer layer. The absorption layer is configured to absorb ultraviolet light during extreme ultraviolet photolithography processes. The method includes exposing an outer portion of a top surface of the buffer layer by removing an outer portion of the absorption layer with a first etching process. The method includes forming trenches in the absorption layer with a second etching process.

The various embodiments described above can be combined to provide further embodiments. Aspects of the embodiments can be modified, if necessary, to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An extreme ultraviolet photolithography mask comprising:
 a substrate;
 a reflective multilayer positioned on the substrate and configured to reflect ultraviolet radiation during extreme ultraviolet photolithography processes;
 a buffer layer positioned on the reflective multilayer;
 an absorption layer positioned on the buffer layer and configured to absorb ultraviolet light during extreme ultraviolet photolithography processes, wherein at least one outer edge of the absorption layer is separated laterally from a corresponding outer edge of the buffer layer such that a peripheral portion of a top surface of the buffer layer is exposed.

2. The extreme ultraviolet photolithography mask of claim 1, wherein the at least one outer edge of the absorption layer is separated laterally from the corresponding outer edge of the buffer layer by 0.2 mm to 2 mm.

3. The extreme ultraviolet photolithography mask of claim 1, wherein the absorption layer includes a plurality of trenches exposing the top surface of the buffer layer.

4. The extreme ultraviolet photolithography mask of claim 1, wherein the buffer layer includes ruthenium.

5. The extreme ultraviolet photolithography mask of claim 1, wherein the absorption layer includes tantalum.

6. The extreme ultraviolet photolithography mask of claim 1, wherein a lateral width of the absorption layer is less than a lateral width of the buffer layer along a same direction.

7. The extreme ultraviolet photolithography mask of claim 1, wherein the reflective multilayer includes a plurality of pairs of layers configured to collectively reflect ultraviolet radiation during extreme ultraviolet photolithography processes.

8. A method, comprising:
 forming, on a substrate, a reflective multilayer configured to reflect ultraviolet radiation during extreme ultraviolet photolithography processes;
 forming a buffer layer on the reflective multilayer; and
 forming an absorption layer on the buffer layer and having a lateral width that is less than a lateral width of the buffer layer along a same direction, wherein the absorption layer is configured to absorb ultraviolet light during extreme ultraviolet photolithography processes.

9. The method of claim 8, wherein forming the absorption layer includes:
 depositing the absorption layer on the buffer layer; and
 exposing an outer perimeter of a top surface of the buffer layer by removing an outer portion of the absorption layer.

10. The method of claim 8, further comprising:
 depositing photoresist on top of the absorption layer, on sidewalls of the absorption layer, and on an out perimeter of the top surface of the buffer layer;
 patterning the photoresist; and
 forming trenches in the absorption layer by performing a plasma etch while the photoresist is covering the sidewalls of the absorption layer.

11. The method of claim 10, wherein the plasma etch includes a chlorine gas.

12. The method of claim 10, wherein the plasma etch selectively etches the absorption layer at a faster rate than the buffer layer.

13. The method of claim 8, wherein the substrate includes silicon dioxide.

14. The method of claim 8, wherein the reflective multilayer includes a plurality of pairs of layers configured to collectively reflect ultraviolet light during extreme ultraviolet photolithography processes.

15. A method, comprising:
 forming, on a substrate, a reflective multilayer configured to reflect ultraviolet light during extreme ultraviolet photolithography processes;
 forming a buffer layer on the reflective multilayer;
 forming an absorption layer on the buffer layer, wherein the absorption layer is configured to absorb ultraviolet light during extreme ultraviolet photolithography processes;
 exposing an outer portion of a top surface of the buffer layer by removing an outer portion of the absorption layer with a first etching process; and
 forming trenches in the absorption layer with a second etching process.

16. The method of claim 15, further comprising:
 covering sidewalls of the absorption layer with photoresist after the first etching process; and
 performing the second etching process while the photoresist covers the sidewalls of the absorption layer.

17. The method of claim 16, wherein covering the sidewalls of the absorption layer with photoresist includes covering the outer portion of the top surface of the buffer layer with photo resist.

18. The method of claim 15, wherein the second etching process selectively etches the absorption layer at a faster rate than the buffer layer.

19. The method of claim 15, wherein the second etching process is a plasma etching process.

20. The method of claim 19, wherein the plasma etching process includes etching the absorption layer with a chlorine gas.

* * * * *